United States Patent [19]
Ooms

[11] Patent Number: 5,049,760
[45] Date of Patent: Sep. 17, 1991

[54] HIGH SPEED COMPLEMENTARY FLIPFLOP

[75] Inventor: William J. Ooms, Chandler, Ariz.

[73] Assignee: Motorola, Inc., Schaumburg, Ill.

[21] Appl. No.: 609,538

[22] Filed: Nov. 6, 1990

[51] Int. Cl.⁵ .......................................... H03K 1/153
[52] U.S. Cl. .................. 307/279; 307/272.2; 307/452; 307/480
[58] Field of Search ............... 307/272.2, 279, 452, 307/480, 481

[56] References Cited
U.S. PATENT DOCUMENTS

| | | | |
|---|---|---|---|
| 4,512,029 | 4/1985 | Brice | 307/279 |
| 4,656,371 | 4/1987 | Binet et al. | 307/272.2 |

Primary Examiner—Stanley D. Miller
Assistant Examiner—Scott A. Ouellette
Attorney, Agent, or Firm—Robert D. Atkins

[57] ABSTRACT

A complementary flipflop circuit is provided combining high speed with substantially zero DC current flow in standby mode between clock signal transitions. A differential input stage having n-channel transistors is gated by one phase of a clock signal for storing a complementary data input signal at the drains of p-channel load transistors which are cross-coupled to the first and second outputs of the differential input stage. The zero DC current flow is provided as the complementary configuration of the p-channel load transistors and the n-channel transistors of the differential input stage maintains isolation between the power supply conductors between transitions of the clock signal thereby reducing the average power consumption. The high operation bandwidth is achieved by using only a single p-channel transistor between the power supply conductors with gallium arsenide material.

17 Claims, 1 Drawing Sheet

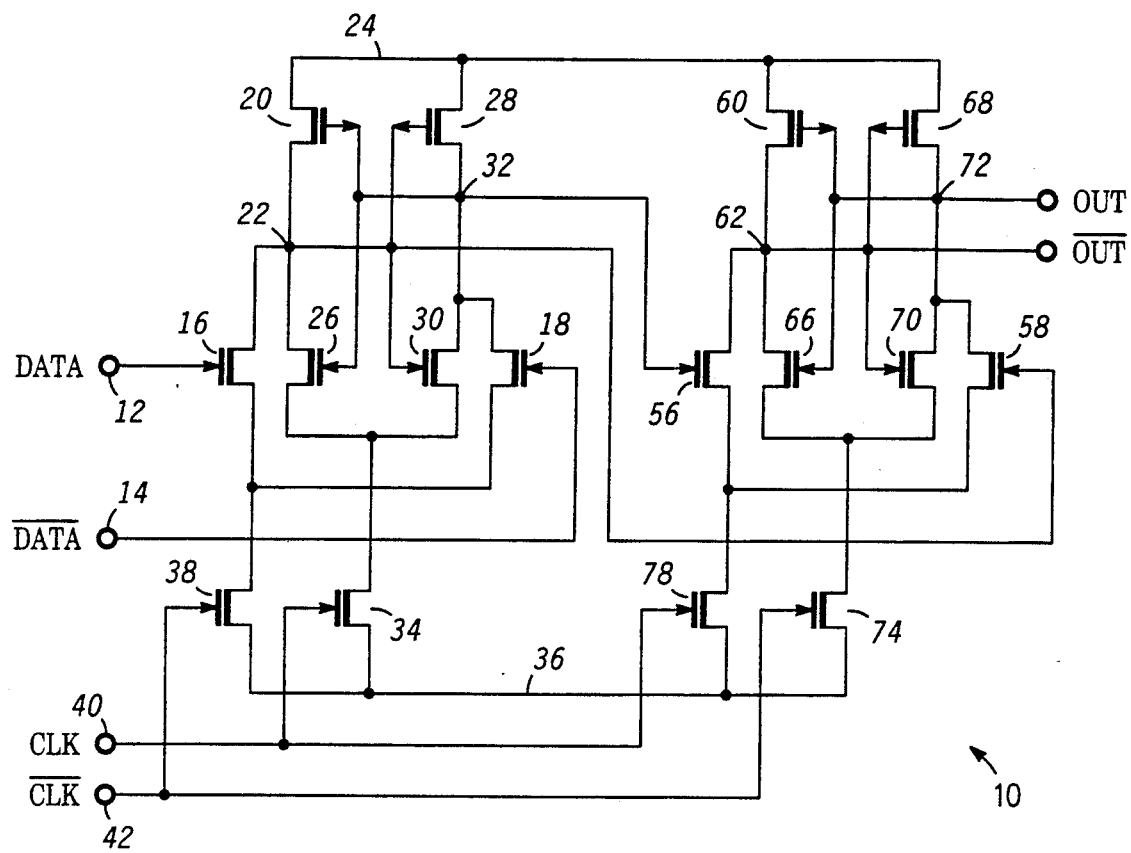
FIG. 1
FIG. 2
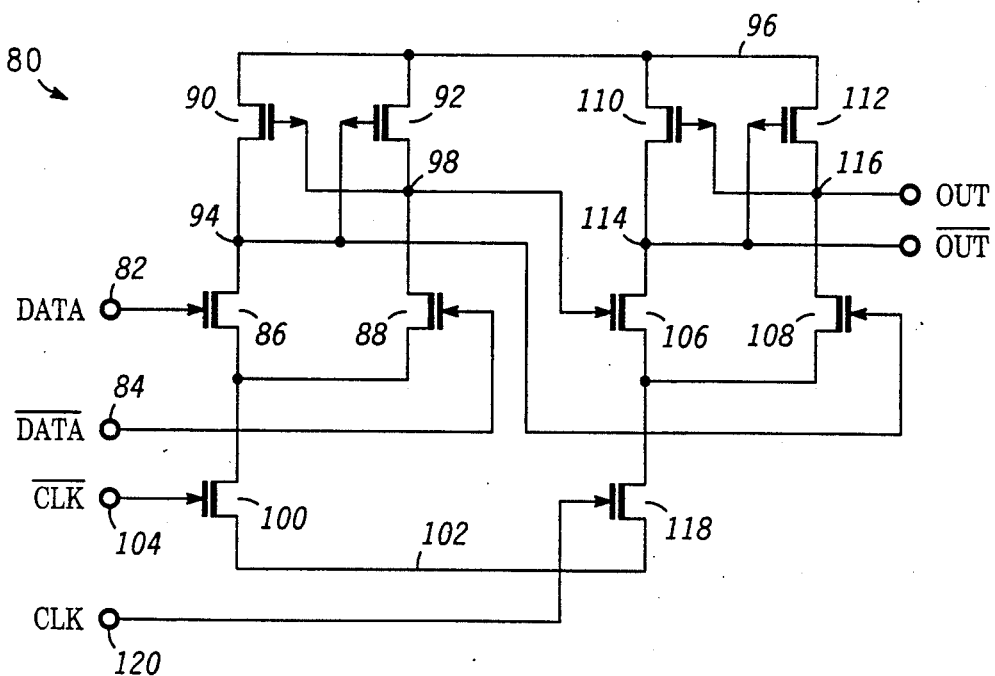

HIGH SPEED COMPLEMENTARY FLIPFLOP

FIELD OF THE INVENTION

This invention relates in general to flipflop circuits and, more particularly, to a high speed complementary flipflop having substantially zero standby current drain.

BACKGROUND OF THE INVENTION

The use of digital flipflop circuits abound in modern electronic systems. In high speed applications, for example frequency synthesizers operating at say one GHz and above, the switching performance of the flipflop circuit becomes an important consideration. Accordingly, many conventional flipflop circuits use only n-channel devices for the inherent higher switching speed associated therewith. Most, if not all, such flipflop circuits using a sole n-channel transistor embodiment include a conventional differential input stage with a constant current source for providing a tail current. Unfortunately, the tail current source continues to flow through the differential input stage even in DC standby mode when the clock signal is between transitions. Thus, regardless of the operational state of the flipflop circuit, the tail current source causes excessive power consumption. It is desirable to eliminate the constant current source and thereby reduce the average power consumption, especially in applications relying on battery power.

An alternate approach to overcome the constant current flow might involve the use of complementary MOS or FET logic, wherein p-channel and n-channel transistors are serially coupled between the power supply rails. The gates of the p-channel and n-channel transistors are driven by a common data input signal and the output is taken at the interconnection of the drains. Due to the complementary operation, one transistor conducts while the other is off, hence, the complementary configuration does not draw DC current in the standby mode between transitions of the clock signal. To implement a flipflop circuit with complementary transistors, it is common in the prior art to further couple at least a second p-channel transistor and n-channel transistor in the serial conduction path between the power supply rails for providing a gating function in response to clock signals $\overline{CLK}$ and CLK, respectively. Yet, the two p-channel transistors in series significantly reduces the switching speed and operational bandwidth of the flipflop circuit, possibly to a point where it becomes unusable in high speed applications. Therefore, while conventional complementary flipflop circuits appear to solve the current drain problem in standby mode, such designs typically suffer in high speed operation due to the inherent slower switching rate of at least two p-channel transistors serially coupled between the power supply conductors.

Hence, there is a need for an improved flipflop circuit combining high speed operation with substantially zero standby current drain.

SUMMARY OF THE INVENTION

Accordingly, an object of the present invention is to provide an improved flipflop circuit.

Another objective of the present invention is to provide an improved flipflop circuit having a minimal number of p-channel transistors coupled between the power supply rails.

A further object of the present invention is to provide an improved flipflop circuit having substantially zero DC current flow in standby mode between clock signal transitions.

Yet another object of the present invention is to provide an improved flipflop circuit having a high operational bandwidth.

In accordance with the above and other objects there is provided an improved flipflop circuit comprising first and second transistors each having a gate coupled for receiving a complementary data input signal and having common sources. The drain of a third transistor is coupled to the drain of the first transistor, and the source of the third transistor is coupled to a first source of operating potential, while the gate is coupled to the drain of the second transistor. A fourth transistor includes a drain coupled to the drain of the second transistor, a source coupled to the first source of operating potential and a gate coupled to the drain of the first transistor. A first circuit is provided for enabling and disabling the conduction path between the sources of the first and second transistors and a second source of operating potential in response to a clock signal. A fifth transistor has a gate coupled to the drain of the second transistor, while a sixth transistor includes a gate coupled to the drain of the first transistor and a source coupled to the source of the fifth transistor. The drain of a seventh is coupled to the drain of the fifth transistor, and the source is coupled to the first source of operating potential, while the gate is coupled to the drain of the sixth transistor. An eighth transistor includes a drain coupled to the drain of the sixth transistor, a source coupled to the first source of operating potential and a gate coupled to the drain of the fifth transistor. A second circuit is provided for enabling and disabling the conduction path between the sources of the fifth and sixth transistors and the second source of operating potential in response to the complement of the clock signal.

BRIEF DESCRIPTION OF THE DRAWINGS

FIG. 1 is a schematic diagram illustrating one embodiment of the present invention; and FIG. 2 is a schematic diagram illustrating an alternate embodiment of the present invention.

DETAILED DESCRIPTION OF THE PREFERRED EMBODIMENT

Referring to FIG. 1, static flipflop circuit 10 is shown suitable for manufacturing in integrated circuit form using complementary gallium arsenide (GaAs) or complementary silicon metal oxide (CMOS) processes. A complementary digital input signal, DATA and $\overline{DATA}$, is applied at inputs 12 and 14 at the gates of field effect transistors 16 and 18, respectively. The drain of transistor 16 is coupled to the drain of p-channel transistor 20 at node 22, and the source of transistor 20 is coupled to power supply conductor 24 typically operating at a positive potential such as $V_{DD}$. Node 22 is also coupled to the drain of transistor 26, to the gate of transistor 28 and to the gate of transistor 30. Likewise, the drain of transistor 18 is coupled to the drain of p-channel transistor 28 at node 32, while the source of transistor 28 is coupled to power supply conductor 24. Node 32 is also coupled to the drain of transistor 30, to the gate of transistor 20 and to the gate of transistor 26. The sources of transistors 26 and 30 are coupled together through transistor 34 to power supply conductor 36 typically operating at ground potential, while the sources of transistors 16 and 18 are also coupled together through transistor 38 to power supply conductor 36. The gates of transistors 34 and 38 are responsive to complementary clock signals CLK and $\overline{\text{CLK}}$ applied at inputs 40 and 42, respectively. The combination of transistors 16-38 comprise the master portion of edge-triggered flipflop 10 for storing complementary DATA and $\overline{\text{DATA}}$ signals at nodes 32 and 22, respectively.

The slave portion of static flipflop 10 includes transistors 56 and 58 each having a gate coupled to node 32 and node 22, respectively, for receiving the DATA and $\overline{\text{DATA}}$ signals. The drain of transistor 56 is coupled to the drain of p-channel transistor 60 at $\overline{\text{OUT}}$ node 62, and the source of transistor 60 is coupled to power supply conductor 24. Node 62 is also coupled to the drain of transistor 66, to the gate of transistor 68 and to the gate of transistor 70. Likewise, the drain of transistor 58 is coupled to the drain of p-channel transistor 68 at OUT node 72, while the source of transistor 68 is coupled to power supply conductor 24. Node 72 is also coupled to the drain of transistor 70, to the gate of transistor 60 and to the gate of transistor 66. The sources of transistors 66 and 70 are coupled together through transistor 74 to power supply conductor 36, while the sources of transistors 56 and 58 are coupled together through transistor 78 to power supply conductor 36. The gates of transistors 74 and 78 are responsive to clock signals $\overline{\text{CLK}}$ and CLK applied at inputs 42 and 40, respectively. It is understood that static flipflop 10 may also be implemented with MOS transistors.

The operation of static flipflop 10 proceeds as follows. The complementary data input signal applied at inputs 12 and 14 is clocked into flipflop 10 with CLK low and $\overline{\text{CLK}}$ high by activating the differential input stage of transistors 16, 18 and 38. Transistor 38 is turned on into saturation while transistor 34 is cut-off thereby disabling differential transistors 26 and 30. With transistor 38 conducting, either transistor 16 or 18 will conduct depending upon the state of data signals DATA and $\overline{\text{DATA}}$. If DATA is high and $\overline{\text{DATA}}$ is low, transistor 16 turns on pulling node 22 low and turning on transistor 28 since it is a p-channel (possibly smaller) load device. Transistor 28 draws node 32 toward $V_{DD}$ at power supply conductor 24 turning off transistor 20. Thus, the first phase of the clock signal establishes DATA and $\overline{\text{DATA}}$ signal levels at node 32 and 22, respectively. Notice that since transistors 18,20,26,30 and 34 are off there is no DC current path between power supply conductor 24 and power supply conductor 36. This reduces the average power consumption of flipflop 10.

During the second phase of the clock signal where CLK is high and $\overline{\text{CLK}}$ is low, transistors 16, 18 and 38 are off and transistor 34 is saturated pulling the sources of transistors 26 and 30 toward the ground potential at power supply conductor 36. The high capacitive charge at node 32 enables transistor 26 for maintaining the low potential at node 22 to keep transistor 28 conducting and the potential at node 32 high. The high signal at node 32 also disables transistor 20 for latching the low signal at node 22. The signal levels at nodes 22 and 32 of the master portion of flipflop 10 remain static provided CLK is high. Transistors 26 and 30 may be sized small since each need only maintain the charge at nodes 22 and 32. Again, with transistors 16, 18, 20, 30 and 38 off there is no DC current path between power supply conductors 24 and 36.

Transistors 56-78 operate similar to the master portion with the exception of inverted clock signals applied at the gates of transistors 74 and 78. While CLK is still high and $\overline{\text{CLK}}$ is low during the second phase of the clock signal, transistor 78 turns on and transistor 74 is cut-off thereby disabling transistors 66 and 70. The low signal at node 22 turns off transistor 58. With transistor 78 conducting and the high signal at node 32, transistor 56 turns on pulling $\overline{\text{OUT}}$ node 62 low and turning on transistor 68. Transistor 68 draws OUT node 72 toward $V_{DD}$ at power supply conductor 24 turning off transistor 60. Thus, the second phase of the clock signal also establishes DATA and $\overline{\text{DATA}}$ signal levels at OUT node 72 and $\overline{\text{OUT}}$ node 62, respectively. Furthermore, no DC current flows between power supply conductors 24 and 36 with transistors 58,60,66,70 and 74 off. As the clock signal returns to the first phase where $\overline{\text{CLK}}$ is high and CLK is low, transistors 56,58 and 78 are off and transistor 74 is saturated pulling the sources of transistors 66 and 70 toward ground potential. The high capacitive charge at OUT node 72 enables transistor 66 for maintaining the low potential at $\overline{\text{OUT}}$ node 62 to keep transistor 68 conducting and the potential at OUT node 72 high. The high signal at OUT node 72 also disables transistor 60 for latching the low signal at $\overline{\text{OUT}}$ node 62. The signal levels at $\overline{\text{OUT}}$ node 62 and OUT node 72 of the slave portion of flipflop 10 are static provided CLK is low and $\overline{\text{CLK}}$ is high. Again, with transistors 56,58,60,70 and 78 off there is no DC current path between power supply conductor 24 and power supply conductor 36. The first phase of the clock signal with CLK is low and $\overline{\text{CLK}}$ is high also moves the next state of DATA and $\overline{\text{DATA}}$ signals applied at inputs 12 and 14 to nodes 32 and 22 in the aforedescribed manner. Thus, the master and slave sections of flipflop 10 are working together with opposite phases of the clock signal for continually transferring the data signal therethrough.

The operation of static flipflop 10 with DATA is low and $\overline{\text{DATA}}$ is high is symmetric with the previous discussion. With CLK is low and $\overline{\text{CLK}}$ high for the first phase of the clock signal, transistor 18 turns on pulling node 32 low and turning on transistor 20 since it is a p-channel load device. Transistor 20 draws node 22 toward $V_{DD}$ at power supply conductor 24, turning off transistor 28 and establishing DATA and $\overline{\text{DATA}}$ signal levels at node 32 and 22, respectively. Transistors 16,28,26, 30 and 34 are off and there is no DC current path between power supply conductor 24 and power supply conductor 36. During the second phase of the clock signal where CLK is high and $\overline{\text{CLK}}$ is low, transistors 16,18 and 38 are off and transistor 34 is saturated pulling the sources of transistors 26 and 30 toward the ground potential at power supply conductor 36. The high capacitive charge at node 22 enables transistor 30 for maintaining the low potential at node 32 to keep transistor 20 conducting and the potential at node 22 high. The high signal at node 22 also disables transistor 28 for latching the low signal at node 32.

While CLK is still high and $\overline{\text{CLK}}$ is low during the second phase of the clock signal, transistor 78 turns on and transistor 74 is cut-off thereby disabling transistors 66 and 70. With transistor 78 conducting and the high signal at node 22, transistor 58 turns on pulling OUT node 72 low and turning on transistor 60. The low signal at node 32 also turns off transistor 56. Transistor 60 draws $\overline{\text{OUT}}$ node 62 toward $V_{DD}$ at power supply conductor 24 turning off transistor 68. Thus, the second phase of the clock signal also establishes DATA and $\overline{\text{DATA}}$ signal levels at OUT node 72 and $\overline{\text{OUT}}$ node 62, respectively. Furthermore, no DC current flows between power supply conductors 24 and 36 with transistors 56, 68, 66, 70 and 74 off. As the clock signal returns to the first phase where $\overline{\text{CLK}}$ is high and CLK is low, transistors 56, 58 and 78 are off and transistor 74 is saturated pulling the sources of transistor 66 and 70 toward ground potential. The high capacitive charge at $\overline{\text{OUT}}$ node 62 enables transistor 70 for maintaining the low potential at OUT node 72 to keep transistor 60 conducting and the potential at $\overline{\text{OUT}}$ node 62 high. The high signal at $\overline{\text{OUT}}$ node 62 also disables transistor 68 for latching the low signal at OUT node 72. Again, the signal levels at $\overline{\text{OUT}}$ node 62 and OUT node 72 of the slave portion of flipflop 10 are static provided CLK is low and $\overline{\text{CLK}}$ is high. The single p-channel transistor (20 or 28) between power supply conductors 24 and 36 allows high speed operation for flipflop 10 especially if the transistors are manufactured with GaAs material.

Turning to FIG. 2, dynamic flipflop circuit 80 is shown also suitable for manufacturing in integrated circuit form using complementary gallium arsenide (GaAs) or complementary silicon metal oxide (CMOS) processes. A complementary digital input signal, DATA and $\overline{\text{DATA}}$, is applied at inputs 82 and 84 at the gates of field effect transistors 86 and 88, respectively. The drain of transistor 86 is coupled to the drain of p-channel load transistor 90 and to the gate of p-channel load transistor 92 at node 94, while the sources of transistors 90 and 92 are coupled together to power supply conductor 96 typically operating at a positive potential such as $V_{DD}$. Furthermore, the drain of transistor 88 is coupled to the drain of p-channel transistor 92 and to the gate of transistor 90 at node 98. The sources of transistors 86 and 88 are coupled together through transistor 100 to power supply conductor 102 typically operating at ground potential, while the gate of transistor 100 is responsive to clock signal $\overline{\text{CLK}}$ applied at input 104. The combination of transistors 86–100 comprise the master portion of edge-triggered flipflop 80 for storing complementary DATA and $\overline{\text{DATA}}$ signals at nodes 98 and 94, respectively.

The slave portion of dynamic flipflop 80 includes transistors 106 and 108 each having a gate coupled to node 98 and node 94, respectively, for receiving the DATA and $\overline{\text{DATA}}$ signals. The drain of transistor 106 is coupled to the drain of p-channel load transistor 110 and to the gate of p-channel load transistor 112 at $\overline{\text{OUT}}$ node 114, while the sources of transistors 110 and 112 are coupled together to power supply conductor 96. The drain of transistor 108 is coupled to the drain of transistor 112 and to the gate of transistor 110 at OUT node 116. The sources of transistors 106 and 108 are coupled together through transistor 118 to power supply conductor 102, while the gate of transistor 118 is responsive to clock signal CLK applied at input 120. The combination of transistors 106–118 comprise the slave portion of edge-triggered flipflop 80 for storing complementary DATA and $\overline{\text{DATA}}$ signals at OUT node 116 and $\overline{\text{OUT}}$ node 114, respectively. It is understood that dynamic flipflop 80 may also be implemented with MOS transistors.

The operation of dynamic flipflop 80 proceeds as follows. The data signal applied at inputs 82 and 84 is clocked into flipflop 80 with CLK is low and $\overline{\text{CLK}}$ high. Transistor 100 is turned on into saturation and either transistor 86 or 88 will conduct depending upon the state of DATA and $\overline{\text{DATA}}$. If DATA is high and $\overline{\text{DATA}}$ is low, transistor 86 turns on pulling node 94 low and turning on transistor 92 since it is a p-channel load device. Transistor 92 draws node 98 toward $V_{DD}$ at power supply conductor 96 turning off transistor 90. Thus, the first phase of the clock signal establishes DATA and $\overline{\text{DATA}}$ signal levels at nodes 98 and 94, respectively. Notice that since transistors 88 and 90 are off there is no DC current path between power supply conductor 96 and power supply conductor 102. During the second phase of the clock signal where CLK is high and $\overline{\text{CLK}}$ is low, transistors 86, 88 and 100 are off and transistor 118 is saturated pulling the sources of transistors 106 and 108 toward the ground potential at power supply conductor 102. The high capacitive charge at node 98 turns on transistor 106 and pulls $\overline{\text{OUT}}$ node 114 low. This turns on transistor 112 and draws OUT node 116 toward $V_{DD}$ at power supply conductor 96 turning off transistor 110. Thus, the second phase of the clock signal also establishes DATA and $\overline{\text{DATA}}$ signal levels at OUT node 116 and $\overline{\text{OUT}}$ node 114, respectively. Furthermore, no DC current flows between power supply conductors 96 and 102 with transistors 110 and 108 off. Thus, the master and slave sections of dynamic flipflop 80 are working together with opposite phases of the clock signal for continuously transferring the data signal therethrough. It is important for the clock signal to operate at least at a predetermined minimum frequency since the charges on nodes 94, 98, 114 and 116 are held only by the associated parasitic capacitances. That is, dynamic flipflop circuit 80 must receive clock transitions before the nodes 94, 98, 114 and 116 discharge through leakage current. This is generally not a problem in high speed applications such as frequency dividers for frequency synthesizers since the clock signal is normally cycling.

There is a tradeoff between static flipflop circuit 10 and dynamic flipflop circuit 80, wherein the latter may operate faster than the former since nodes 94, 98, 114 and 116 have smaller capacitive loads because of the fewer components coupled thereto as compare to nodes 22, 32, 62 and 72. Moreover, the clock signal applied to dynamic flipflop 80 drives fewer transistors which also improves the operational bandwidth. However, static flipflop circuit 10 does not require continuous clock transitions to maintain the data signal.

The preferred embodiment of the present invention is to use GaAs field effect transistors for the higher speed although silicon field effect transistors and metal oxide technologies are also suitable for lower speed applications. The single p-channel load transistor between the power supply conductors in combination with GaAs material provides the high speed operation while the complementary configuration draws substantially zero standby current. This is especially useful in battery operated circuits. A variation on flipflop circuits 10 and 80 may include additional transistors serially coupled in the differential input stage, such as between the sources of transistors 16 and 18 and the drain of transistor 38 for providing further gating functions. Furthermore, the clock and data signals may be swapped without effecting the fundamental operation.

Hence, what has been provided is a novel flipflop circuit providing a high operational bandwidth with a minimal number of p-channel load transistors between the power supply conductors while reducing the average power consumption by drawing substantially zero DC current in standby mode between clock signal transitions due to the complementary configuration of the n-channel transistors of the differential input stage and the p-channel load transistors.

I claim:

1. A flipflop circuit, comprising:
   first and second transistors each having a gate, a drain and a source, said gates being coupled for receiving a complementary data input signal, said sources being coupled together;
   a third transistor having a gate, a drain and a source, said drain being coupled to said drain of said first transistor, said source being coupled to a first source of operating potential, said gate being coupled to said drain of said second transistor;
   a fourth transistor having a gate, a drain and a source, said drain being coupled to said drain of said second transistor, said source being coupled to said first source of operating potential, said gate being coupled to said drain of said first transistor;
   first means for enabling and disabling the conduction path between said sources of said first and second transistors and a second source of operating potential in response to an inverted clock signal;
   a fifth transistor having a gate, a drain and a source, said gate being coupled to said drain of said second transistor, said drain providing an inverted output signal of the flipflop circuit;
   a sixth transistor having a gate, a drain and a source, said gate being coupled to said drain of said first transistor, said sources of said fifth and sixth transistors being coupled together, said drain providing an output signal of the flipflop circuit;
   a seventh transistor having a gate, a drain and a source, said drain being coupled to said drain of said fifth transistor, said source being coupled to said first source of operating potential, said gate being coupled to said drain of said sixth transistor;
   an eighth transistor having a gate, a drain and a source, said drain being coupled to said drain of said sixth transistor, said source being coupled to said first source of operating potential, said gate being coupled to said drain of said fifth transistor;
   second means for enabling and disabling the conduction path between said sources of said fifth and sixth transistors and said second source of operating potential in response to a clock signal;
   a ninth transistor having a gate, a drain and a source, said drain being coupled to said drain of said first transistor and to said drain of said third transistor, said gate being coupled to said drain of said second transistor and to said gate of said third transistor;
   a tenth transistor having a gate, a drain and a source, said drain being coupled to said drain of said second transistor and to said drain of said fourth transistor, said gate being coupled to said drain of said first transistor and to said gate of said fourth transistor, said sources of said ninth and tenth transistors being coupled together; and
   third means for enabling and disabling the conduction path between said sources of said ninth and tenth transistors and said second source of operating potential in response to said clock signal.

2. The flipflop circuit of claim 1 wherein said first means includes an eleventh transistor having a gate, a drain and a source, said gate being coupled for receiving said inverted clock signal, said drain being coupled to said sources of said first and second transistors, said source being coupled to said second source of operating potential.

3. The flipflop circuit of claim 2 wherein said second means includes a twelfth transistor having a gate, a drain and a source, said gate being coupled for receiving said clock signal, said drain being coupled to said sources of said fifth and sixth transistors, said source being coupled to said second source of operating potential.

4. The flipflop circuit of claim 3 further including:
   a thirteenth transistor having a gate, a drain and a source, said drain being coupled to said drain of said fifth transistor and to said drain of said seventh transistor, said gate being coupled to said drain of said sixth transistor and to said gate of said seventh transistor;
   a fourteenth transistor having a gate, a drain and a source, said drain being coupled to said drain of said sixth transistor and to said drain of said eighth transistor, said gate being coupled to said drain of said fifth transistor and to said gate of said eighth transistor, said source being coupled to said source of said thirteenth transistor; and
   fourth means for enabling and disabling the conduction path between said sources of said thirteenth and fourteenth transistors and said second source of operating potential in response to said inverted clock signal.

5. The flipflop circuit of claim 4 wherein said third means includes a fifteenth transistor having a gate, a drain and a source, said gate being coupled for receiving said clock signal, said drain being coupled to said sources of said ninth and tenth transistors, said source being coupled to said second source of operating potential.

6. The flipflop circuit of claim 5 wherein said fourth means includes a sixteenth transistor having a gate, a drain and a source, said gate being coupled for receiving said inverted clock signal, said drain being coupled to said sources of said thirteenth and fourteenth transistors, said source being coupled to said second source of operating potential.

7. A circuit, comprising:
   first and second transistors each having a gate, a drain and a source, said gates being coupled for receiving a complementary data input signal, said sources being coupled together;
   a third transistor having a gate, a drain and a source, said drain being coupled to said drain of said first transistor, said source being coupled to a first source of operating potential, said gate being coupled to said drain of said second transistor;
   a fourth transistor having a gate, a drain and a source, said drain being coupled to said drain of said second transistor, said source being coupled to said first source of operating potential, said gate being coupled to said drain of said first transistor;
   first means for enabling and disabling the conduction path between said sources of said first and second transistors and a second source of operating potential in response to a clock signal;
   a fifth transistor having a gate, a drain and a source, said drain being coupled to said drain of said first transistor and to said drain of said third transistor, said gate being coupled to said drain of said second transistor and to said gate of said third transistor;
   a sixth transistor having a gate, a drain and a source, said drain being coupled to said drain of said second transistor and to said drain of said fourth transistor, said gate being coupled to said drain of said first transistor and to said gate of said fourth transistor, said source being coupled to said source of said fifth transistor; and second means for enabling and disabling the conduction path between said sources of said fifth and sixth transistors and said second source of operating potential in response to the complement of said clock signal.

8. The circuit of claim 7 wherein said first means includes a seventh transistor having a gate, a drain and a source, said gate being coupled for receiving said clock signal, said drain being coupled to said sources of said first and second transistors, said source being coupled to said second source of operating potential.

9. The circuit of claim 8 wherein said second means includes an eighth transistor having a gate, a drain and a source, said gate being coupled for receiving the complement of said clock signal, said drain being coupled to said sources of said fifth and sixth transistors, said source being coupled to said second source of operating potential.

10. The circuit of claim 9 further comprising:
a ninth transistor having a gate, a drain and a source, said gate being coupled to said drain of said second transistor;
a tenth transistor having a gate, a drain and a source, said gate being coupled to said drain of said first transistor, said source being coupled to said source of said ninth transistor;
an eleventh transistor having a gate, a drain and a source, said drain being coupled to said drain of said ninth transistor, said source being coupled to said first source of operating potential, said gate being coupled to said drain of said tenth transistor;
a twelfth transistor having a gate, a drain and a source, said drain being coupled to said drain of said tenth transistor, said source being coupled to said first source of operating potential, said gate being coupled to said drain of said ninth transistor; and
a thirteenth transistor having a gate, a drain and a source, said gate being coupled for receiving the complement of said clock signal, said drain being coupled to said sources of said ninth and tenth transistors, said source being coupled to said second source of operating potential.

11. The circuit of claim 10 further comprising:
a fourteenth transistor having a gate, a drain and a source, said drain being coupled to said drain of said ninth transistor and to said drain of said eleventh transistor, said gate being coupled to said drain of said tenth transistor and to said gate of said eleventh transistor;
a fifteenth transistor having a gate, a drain and a source, said drain being coupled to said drain of said tenth transistor and to said drain of said twelfth transistor, said gate being coupled to said drain of said ninth transistor and to said gate of said twelfth transistor, said source being coupled to said source of said fourteenth transistor; and
a sixteenth transistor having a gate, a drain and a source, said gate being coupled for receiving said clock signal, said drain being coupled to said sources of said fourteenth and fifteenth transistors, said source being coupled to said second source of operating potential.

12. An integrated flipflop circuit, comprising:
first and second transistors each having a gate, a drain and a source, said gates being coupled for receiving a complementary data input signal, said sources being coupled together;
a third transistor having a gate, a drain and a source, said drain being coupled to said drain of said first transistor, said source being coupled to a first source of operating potential, said gate being coupled to said drain of said second transistor;
a fourth transistor having a gate, a drain and a source, said drain being coupled to said drain of said second transistor, said source being coupled to said first source of operating potential, said gate being coupled to said drain of said first transistor;
first means for enabling and disabling the conduction path between said sources of said first and second transistors and a second source of operating potential in response to an inverted clock signal;
a fifth transistor having a gate, a drain and a source, said gate being coupled to said drain of said second transistor, said drain providing an inverted output signal of the flipflop circuit;
a sixth transistor having a gate, a drain and a source, said gate being coupled to said drain of said first transistor, said sources of said fifth and sixth transistors being coupled together, said drain providing an output signal of the flipflop circuit;
a seventh transistor having a gate, a drain and a source, said drain being coupled to said drain of said fifth transistor, said source being coupled to said first source of operating potential, said gate being coupled to said drain of said sixth transistor;
an eighth transistor having a gate, a drain and a source, said drain being coupled to said drain of said sixth transistor, said source being coupled to said first source of operating potential, said gate being coupled to said drain of said fifth transistor;
second means for enabling and disabling the conduction path between said sources of said fifth and sixth transistors and said second source of operating potential in response to a clock signal;
a ninth transistor having a gate, a drain and a source, said drain being coupled to said drain of said first transistor and to said drain of said third transistor, said gate being coupled to said drain of said second transistor and to said gate of said third transistor;
a tenth transistor having a gate, a drain and a source, said drain being coupled to said drain of said second transistor and to said drain of said fourth transistor, said gate being coupled to said drain of said first transistor and to said gate of said fourth transistor, said sources of said ninth and tenth transistors being coupled together; and
third means for enabling and disabling the conduction path between said sources of said ninth and tenth transistors and said second source of operating potential in response to said clock signal.

13. The flipflop circuit of claim 12 wherein said first means includes an eleventh transistor having a gate, a drain and a source, said gate being coupled for receiving said inverted clock signal, said drain being coupled to said sources of said first and second transistors, said source being coupled to said second source of operating potential.

14. The flipflop circuit of claim 13 wherein said second means includes a twelfth transistor having a gate, a drain and a source, said gate being coupled for receiving said clock signal, said drain being coupled to said sources of said fifth and sixth transistors, said source being coupled to said second source of operating potential.

15. The flipflop circuit of claim 14 further including:
a thirteenth transistor having a gate, a drain and a source, said drain being coupled to said drain of said fifth transistor and to said drain of said seventh transistor, said gate being coupled to said drain of said sixth transistor and to said gate of said seventh transistor;
a fourteenth transistor having a gate, a drain and a source, said drain being coupled to said drain of said sixth transistor and to said drain of said eighth transistor, said gate being coupled to said drain of said fifth transistor and to said gate of said eighth transistor, said source being coupled to said source of said thirteenth transistor; and fourth means for enabling and disabling the conduction path between said sources of said thirteenth and fourteenth transistors and said second source of operating potential in response to said inverted clock signal.

16. The flipflop circuit of claim 15 wherein said third means includes a fifteenth transistor having a gate, a drain and a source, said gate being coupled for receiving said clock signal, said drain being coupled to said sources of said ninth and tenth transistors, said source being coupled to said second source of operating potential.

17. The flipflop circuit of claim 16 wherein said fourth means includes a sixteenth transistor having a gate, a drain and a source, said gate being coupled for receiving said inverted clock signal, said drain being coupled to said sources of said thirteenth and fourteenth transistors, said source being coupled to said second source of operating potential.

* * * * *